(12) United States Patent
Honda et al.

(10) Patent No.: US 9,604,275 B2
(45) Date of Patent: Mar. 28, 2017

(54) COVERING MEMBER WITH EXCELLENT SLIDING PROPERTIES

(71) Applicants: Hitachi Tool Engineering, Ltd., Minato-ku, Tokyo (JP); HITACHI METALS, LTD., Minato-ku, Tokyo (JP)

(72) Inventors: Fumiaki Honda, Matsue (JP); Kenichi Inoue, Matsue (JP)

(73) Assignee: HITACHI METALS, LTD., Tokyo (JP)

( * ) Notice: Subject to any disclaimer, the term of this patent is extended or adjusted under 35 U.S.C. 154(b) by 306 days.

(21) Appl. No.: 14/241,614

(22) PCT Filed: Sep. 26, 2012

(86) PCT No.: PCT/JP2012/074627
§ 371 (c)(1),
(2) Date: Feb. 27, 2014

(87) PCT Pub. No.: WO2013/047548
PCT Pub. Date: Apr. 4, 2013

(65) Prior Publication Data
US 2014/0234582 A1    Aug. 21, 2014

(30) Foreign Application Priority Data

Sep. 28, 2011  (JP) ................................. 2011-211963
Mar. 27, 2012  (JP) ................................. 2012-071223

(51) Int. Cl.
  *B21J 13/02*  (2006.01)
  *C23C 28/04*  (2006.01)
  (Continued)

(52) U.S. Cl.
CPC ........... *B21J 13/02* (2013.01); *C23C 14/0641* (2013.01); *C23C 28/042* (2013.01);
(Continued)

(58) Field of Classification Search
CPC .... B21J 13/02; C23C 14/0641; C23C 28/042; C23C 28/42; C23C 28/044;
(Continued)

(56) References Cited

U.S. PATENT DOCUMENTS

2006/0032602 A1*  2/2006  Inoue .................. B22D 17/2209
                                              164/312
2007/0269610 A1   11/2007  Fukui et al.
(Continued)

FOREIGN PATENT DOCUMENTS

CN       1470350 A     1/2004
CN       1876368 A    12/2006
(Continued)

OTHER PUBLICATIONS

Extended European Search Report dated Apr. 10, 2015, issued by the European Patent Office in counterpart European application No. 12835242.4.

*Primary Examiner* — Laura Auer
(74) *Attorney, Agent, or Firm* — Sughrue Mion, PLLC (57) ABSTRACT

In order to provide a covered member for which unexpected galling is suppressed in the initial stages when the member is used, and which has excellent sliding properties, a covered member has a hard film on the working surface and has excellent sliding properties, said hard film including an A layer, for which an a1 layer comprising a nitride, carbonitride, or oxynitride having 30% or more of chromium in terms of atomic ratio in metal (including metalloid; the same shall apply hereinafter) component, and an a2 layer comprising a nitride, carbonitride, or oxynitride having 60% or more of vanadium in terms of atomic ratio in metal component, are alternately laminated, and a B layer on the upper layer of said A layer and comprising a nitride, carbonitride, or oxynitride having 60% or more of vanadium in terms of atomic ratio in metal component. The film thickness of each (Continued)

a1 layer and a2 layer of the A layer is 50 nm or less, with the film thickness of the a2 layer being greater than that of the a1 layer, and the film thickness of the B layer is 0.1 mum or greater.

11 Claims, 2 Drawing Sheets

(51) Int. Cl.
  *C23C 28/00* (2006.01)
  *C23C 14/06* (2006.01)
(52) U.S. Cl.
  CPC ............ *C23C 28/044* (2013.01); *C23C 28/42* (2013.01); *Y10T 428/24355* (2015.01); *Y10T 428/24967* (2015.01); *Y10T 428/24975* (2015.01)
(58) Field of Classification Search
  CPC ..... Y10T 428/24355; Y10T 428/24975; Y10T 428/24967
  See application file for complete search history.

(56) References Cited

U.S. PATENT DOCUMENTS

2007/0275179 A1\* 11/2007 Astrand ............... C23C 14/0641
  427/524
2011/0183131 A1\* 7/2011 Maeda .................... B23F 21/00
  428/216

FOREIGN PATENT DOCUMENTS

| CN | 101376178 A | 3/2009 |
| JP | 2001-310202 A | 11/2001 |
| JP | 2003-321764 A | 11/2003 |
| JP | 2005-42146 A | 2/2005 |
| JP | 2005-256081 A | 9/2005 |
| JP | 2007-111815 A | 5/2007 |
| JP | 2008-188738 A | 8/2008 |
| JP | 2010-115761 A | 5/2010 |
| JP | 2011-183545 A | 9/2011 |

\* cited by examiner

COVERING MEMBER WITH EXCELLENT SLIDING PROPERTIES

CROSS REFERENCE TO RELATED APPLICATIONS

This application is a National Stage of International Application No. PCT/JP2012/074627 filed Sep. 26, 2012 (claiming priority based on Japanese Patent Application Nos. 2011-211963 filed Sep. 28, 2011 and 2012-071223 dated Mar. 27, 2012), the contents of which are incorporated herein by reference in their entirety.

TECHNICAL FIELD

The present invention relates to covered members which are required to have sliding properties such as abrasion resistance and galling resistance in environments where they slide on workpieces, such as sliding components that constitute various machines, and press working dies and forging dies.

BACKGROUND ART

In recent years, methods for increasing abrasion resistance and galling resistance of working surfaces of dies by surface-treating the working surfaces in various ways have been widely employed. Among these methods, a method that involves coating (covering) allows covering with a hard film having a Vickers hardness (HV) of higher than 1000 and provides excellent adhesion with a surface of a base material, so that a covered die obtained by applying the method has a greatly-extended life.

Practical examples of the hard film include a film of a titanium carbide (which is represented by TiC as for element symbol; the same shall apply hereinafter) deposited by a chemical vapor deposition method (CVD method), a film of VC deposited by a salt-bath method, and films of TiCN, TiC, VCN, VC, CrN, CrAlN, AlCrN, etc. deposited by a physical vapor deposition method (PVD method). Among the various covering means, the PVD method is effective in a process of covering a die, as the PVD method allows covering to be carried out at a temperature that is equal to or lower than a tempering temperature.

Moreover, with advancing enhancements in strength of workpieces, advancing increases in precision of processed products, and advancing increases in speed of molding cycles, load on the working surfaces of plastic working dies have been increased. Under these circumstances, covered dies having hard films on the working surfaces have been heavily used. Especially in the case of dies for use in cold working, TiCN and TiC have been used, as they are high in hardness and low in coefficient of friction.

Recent dies have come to be required to have excellent heat resistance so as to be able to deal with warm and hot working in addition to further increases in strength of workpieces and complication in die shapes. In view of these requirements, as a hard film deposited on a die by the PVD method, there is, for example, an AlCrSi nitride film, which is manufactured by adding a third element to the AlCr nitride film, which is excellent in abrasion resistance and oxidation resistance (Patent Literatures 1 and 2).

Meanwhile, in the field of cutting tools, a hard film is disclosed in which CrN and a nitride are laminated, the nitride being a nitride of at least one element selected from among the Group 4a elements, the Group 5a elements, the Group 6a elements, Al, and Si, which are excellent in abrasion resistance and heat resistance (Patent Literature 3).

Furthermore, as a hard film suitable for a cutting tool and a slide member, a hard film is disclosed in which a chromium nitride and VN are alternately laminated (Patent Literature 4).

A certain degree of extension of life of a die is expected by providing a hard film of any one of Patent Literatures 1 to 4 on a surface of the die. However, when used for a plastic working die, such as a press working die or a forging die, which is in a particularly harsh sliding environment, the hard film suffers significantly from wear such as abrasion or galling due to sliding of the working surface against a workpiece, and there has been room for improvement in sliding properties.

The applicants of the present application propose, as means for improving sliding properties, a covered tool whose base material has a surface covered with a hard film in which an AlCrSi nitride and a V nitride are alternately laminated, the hard film having a film thickness of 3 µm or greater, a surface roughness Ra of less than 0.2 µm, a surface roughness Rz of less than 2.0 µm, and a surface roughness Rsk of less than 0 (Patent Literature 5).

CITATION LIST

Patent Literature

Patent Literature 1: JP-A-2005-042146
Patent Literature 2: JP-A-2003-321764
Patent Literature 3: JP-A-2007-111815
Patent Literature 4: JP-A-2005-256081
Patent Literature 5: JP-A-2011-183545

SUMMARY OF INVENTION

Technical Problem

The covered tool described in Patent Literature 5 proposed by the applicants of the present application is excellent in sliding properties because its hard film contains a nitride of V, which is excellent in sliding properties, and, furthermore, has a flat and smooth film structure with less projections on the film surface, which comes to be an origin of attack on a workpiece. However, depending on conditions of use, an insufficient conformability between a die and a workpiece in the initial stages of using the die may cause chattering vibrations, which, in turn, may cause unexpected galling and reduce the life of the die. The term "galling of a die" here means a local seizure on the die surface. The term "seizure on a die surface" means a phenomenon in which when the die surface and the workpiece slide against each other, frictional heating occurs, for example, due to insufficient lubrication, thereby roughening the die surface and/or welding the friction surfaces to melt and stick to each other.

The present inventors diligently studied damaged states of covered dies under harsh conditions of use, and found that wear of a hard film occurs either due to local adhesion of a workpiece, or due to an abrasion powder that is produced during sliding. Moreover, the present inventors finally discovered that in the case of a conventional covered die, the tendency to local adhesion of a workpiece leads to uneven slide resistance on the film surface and the uneven slide resistance causes unexpected galling or seizing, so that damage may occur in the initial stages. Further, the present inventors found that in the case of an iron-based workpiece, a ferrioxide that is produced in the form of an abrasion powder from the workpiece causes damage to the film surface, so that damage tends to occur in the initial stages.

In view of these problems, the present invention has an object to provide a covered member for which unexpected galling is suppressed in the initial stages and which has excellent sliding properties. In particular, the present invention has an object to provide a covered member which has excellent sliding properties in usage environments ranging from cold working to warm and hot working, and which is most suitable for plastic working.

Solution to Problem

As a result of their diligent study of a method for suppressing unexpected galling in the initial stages and, furthermore, exhibiting excellent sliding properties even after a long period of use, the present inventors found that there are an elemental constitution and a film structure that are most suitable for taking advantage of such sliding properties.

That is, the present invention is directed to a covered member with excellent sliding properties having a hard film on a working surface, the hard film including: an A layer, in the A layer an a1 layer and an a2 layer being alternately laminated, the a1 layer comprising a nitride, carbonitride, or oxynitride having 30% or more of chromium in terms of atomic ratio in metal (including metalloid; the same shall apply hereinafter) component, the a2 layer comprising a nitride, carbonitride, or oxynitride having 60% or more of vanadium in terms of atomic ratio in metal component; and a B layer on top of the A layer, the B layer comprising a nitride, carbonitride, or oxynitride having 60% or more of vanadium in terms of atomic ratio in metal component, wherein each of the a1 and a2 layers of the A layer has a film thickness of 50 nm or less, with the film thickness of the a2 layer being greater than that of the a1 layer, the B layer having a film thickness of 0.1 µm or greater.

Further, it is preferable that the film thickness of the a2 layer be 1.5 or more times greater than that of the a1 layer. Furthermore, it is preferable that the film thickness of the a2 layer be 2.0 or more and 4.0 or less times greater than that of the a1 layer.

Further, it is preferable that the A and B layers have a total film thickness of 4 µm or greater and 20 µm or less. Furthermore, it is preferable that the A and B layers have a total film thickness of 8 µm or greater.

Further, it is preferable that the B layer have a surface roughness Ra of less than 0.2 µm, a surface roughness Rz of less than 2.0 µm, and a surface roughness Rsk of less than 0.

Further, it is preferable that the B layer have a film thickness of 0.2 µm or greater. Furthermore, it is preferable that the B layer have a film thickness of 8 µm or less.

Further, it is preferable that the a1 layer contain 10% or more of aluminum in terms of atomic ratio in metal component.

Further, it is preferable that the a1 layer contain 1 to 10% of silicon in terms of atomic ratio in metal (including metalloid) component.

Further, it is preferable that the covered member be a die.

Advantageous Effects of Invention

The present invention, for example, suppresses galling in the initial stages when the die is used and suppresses abrasion of the die with excellent sliding properties over a range of uses from cold working to warm and hot working, thus making it possible to dramatically extend the life of the covered member such as the die.

DESCRIPTION OF EMBODIMENTS

The present inventors found that, as an film structure for improving sliding properties, a configuration is effective in which a layer of a compound containing a certain amount of chromium and a layer of a compound composed mainly of vanadium are mutually laminated at a nano-level with their respective thicknesses being controlled and, furthermore, in which the resulting film of mutually laminated layers has its upper surface covered with a thick film of a compound composed mainly of vanadium. The following describes the details of this configuration.

First, a description is given of an A layer in which an a1 layer and an a2 layer are alternately laminated, the a1 layer comprising a nitride, carbonitride, or oxynitride having 30% or more of chromium in terms of atomic ratio in metal component, the a2 layer comprising a nitride, carbonitride, or oxynitride having 60% or more of vanadium in terms of atomic ratio in metal component.

CrN and chromium compounds obtained by adding an effective element thereto, such as CrAlN and CrSiN, which have conventionally been widely applied to cutting tools and dies, are excellent in abrasion resistance and heat resistance.

Especially in the case of a die that is used in a high-load environment where frictional heat is generated during sliding, the application of a film containing a certain amount of chromium is effective in extending the life of the member. In simultaneous pursuit of heat resistance and abrasion resistance, the present invention applies, as one of the layers that constitute the laminated structure, the a1 layer comprising a nitride, carbonitride, or oxynitride having 30% or more of chromium in terms of atomic ratio in metal component. With a lower content of chromium, the a1 layer tends to be poor in heat resistance and abrasion resistance and to deteriorate in sliding properties.

In terms of manufacturing cost, it is preferable to apply a nitride, carbonitride, or oxynitride of chromium that forms a film by using a simple metal target.

Meanwhile, regarding the compound composed mainly of vanadium, vanadium is moderately oxidized in an operating temperature range of 25 to 200° C. to form a thin oxidized layer on the surface of the base material, thus decreasing the affinity with a mating material (workpiece). This makes it possible to reduce the adhesion of the workpiece to the film surface during use of the die. Moreover, in the case of an iron-based workpiece, the oxide of vanadium reacts with a ferrioxide that is in the form of the surface of the workpiece or an abrasion powder to soften the ferrioxide, thus reducing attackability on the film.

Further, the effect of the oxide of vanadium softening the ferrioxide of a workpiece tends to suppress the production of an abrasion powder during sliding, thus making it possible to suppress local scratching or galling on the working surface during press molding.

In order to produce sufficient quantities of the oxide of vanadium, which is excellent in sliding properties, the present invention applies, as one of the layers that constitute the laminated structure, the a2 layer comprising a nitride, carbonitride, or oxynitride having 60% or more, more preferably 70% or more, and even more preferably 80% or more of vanadium in terms of atomic ratio in metal component.

In terms of manufacturing cost, it is preferable to apply a nitride, carbonitride, or oxynitride of vanadium that forms a film by using a simple metal target.

In order to effectively take advantage of the properties of both the a1 layer, which is excellent in abrasion resistance and heat resistance, and the a2 layer, which is excellent in sliding properties, the present invention sets each of these laminated films to have a film thickness of 50 nm or less. Controlling the film thickness of each of these laminated films in this manner allows the resulting covered member to have these properties in a balanced manner. Moreover, since the generation of asperities on the film sliding surface is reduced in each temperature environment during use, and since attackability on the workpiece is low, damage such as galling that occurs during sliding is suppressed, so that the life of the member can be extended. In particular, it is preferable that the laminated films be applied to a plastic working die which is used in an environment where the working surface of the die severely slides against the workpiece. It is more preferable that the film thickness of each of these laminated films be less than 30 nm, even more preferably less than 10 nm.

The film thickness of each of these laminated films can be adjusted by controlling input electrical power that is applied to the target, the chamber volume of an apparatus for use in deposition, the number of revolutions of a table, and the like.

Furthermore, in order to give sufficient sliding properties even in a harsh usage environment, the present invention sets the film thickness of the a2 layer to be greater than that of the a1 layer. Furthermore, for the production of sufficient quantities of the oxide of vanadium, which enhances sliding properties, it is preferable that the film thickness of the a2 layer be 1.5 or more times greater than that of the a1 layer. It is more preferable that the film thickness of the a2 layer be 2.0 or more times greater than that of the a1 layer.

Further, in an operating temperature range of about 300° C. or higher, the compound composed mainly of vanadium is further oxidized, so that an excess of oxide is formed. Thus, depending on usage environments, there may be deterioration in abrasion resistance. For this reason, it is preferable that the film thickness of the a2 layer be 4.0 or less times greater than that of the a1 layer.

For further excellence in abrasion resistance and heat resistance, it is preferable that the a1 layer and the a2 layer be a nitride. Further, as long as they are each composed mainly of a nitride, they can exhibit excellent abrasion resistance and heat resistance even if they each contain a carbide, an oxide, and/or the like as a part thereof.

In order for the A layer to exert its effects, it is preferable that the A layer have a film thickness of 3 μm or greater, more preferably 5 μm or greater.

Between the base material and the A layer, a hard film such as metal film, a carbide film, a carbonitride film, or a nitride film may be sandwiched to ensure adhesion.

In simultaneous pursuit of abrasion resistance and heat resistance in a harsher usage environment, it is preferable that the a1 layer contain 10% or more, more preferably 30% or more, of aluminum in terms of atomic ratio in metal component. With a larger additive amount of aluminum in the a1 layer, the crystal structure of the a1 layer tends to be mainly a hexagonal crystal structure, which is fragile. In order for the a1 layer to have its crystal structure maintained as a cubic structure, it is preferable that the aluminum content be 70% or less, more preferably 65% or less in terms of atomic ratio in metal component.

For improvement in hardness of the film, for example, for further improvement in abrasion resistance of the die, it is preferable that the a1 layer contain 1 to 10% of silicon in terms of atomic ratio in metal component.

In order for the A layer to have a Vickers hardness of 2000 $HV_{10}$ or greater or, what is more, to have a higher hardness of 2500 $HV_{10}$ or greater, it is preferable that the a1 layer contain silicon.

With a lower content of silicon, there is no sufficient improvement in hardness. With a higher content of silicon, on the other hand, there tends to be degradation in toughness of the film.

Next, a description is given of the B layer on top of the A layer, the B layer comprising a nitride, carbonitride, or oxynitride composed mainly of vanadium. The B layer is the most important feature of the present invention.

As stated above, the compound composed mainly of vanadium is moderately oxidized by heat during sliding to serve as a lubricant layer. Thus, by mutually laminating the a1 layer, which is excellent in abrasion resistance and heat resistance, and the a2 layer, which is excellent in sliding properties, at a nano-level, a certain degree of sliding properties is ensured. However, simply doing so does not create a sufficient conformability between the die and the workpiece in the initial stages when the tool is used, so that unexpected galling may occur in the initial stages.

Thus, by providing, as a layer on top of the A layer, the compound composed mainly of vanadium with a film thickness of 0.1 μm or greater, which is greater than the film thickness of the individual a2 layer of the film of mutually laminated layers, the oxide of vanadium, which exhibits an excellent lubrication effect, is produced in sufficient quantities from the initial stages when the die is used. This suppresses unexpected galling in the initial stages. It is more preferable that the B layer have a film thickness of 0.2 μm or greater.

With a smaller film thickness, there is an insufficient conformability between the die and the workpiece in the initial stages, so that unexpected galling tends to occur. Further, in the case of the die having a complex shape, there tends to be variations in film component and hue in the die site. With excessive film thickness, it takes time for the B layer to be deposited, so that there is a decrease in productivity. Thus, it is preferable that the B layer have a film thickness of 8 μm or less. Further, depending on usage environments, there may be deterioration in abrasion resistance of the film as a whole. Thus, it is more preferable that the B layer have a film thickness of 5 μm or less, even more preferably 3 μm or less.

In order to produce sufficient quantities of the oxide of vanadium, which is excellent in sliding properties, the present invention applies, as the B layer, a nitride, carbonitride, or oxynitride having 60% or more of vanadium in terms of atomic ratio in the metal component. It is preferable that the vanadium content be 70% or more, more preferably 80% or more in terms of atomic ratio in metal component.

In terms of manufacturing cost, it is preferable to apply a nitride, carbonitride, or oxynitride of vanadium that forms a film by using a simple metal target.

For a simple film structure and ease of manufacture, it is preferable that the B layer be provided directly on the A layer.

For further excellence in abrasion resistance and heat resistance, it is preferable to provide a nitride of vanadium as the B layer. Further, as long as the B layer is composed mainly of a nitride, the B layer can exhibit excellent abrasion resistance and heat resistance even if the B layer contains a carbide, an oxide, and/or the like as a part thereof.

In the present invention, it is preferable that the A and B layers have a total film thickness of 4 μm or greater and 20 μm or less.

For example, in the case of a die for use in press molding, where a film surface is subjected to a great deal of force, a reduction in thickness of the film causes the film to be poor in strength and therefore susceptible to damage. Especially in a high-load environment, where the interface between the film and the base material is subjected to a great deal of force, the difference in elastic deformation between the film and the base material causes the film to be susceptible to detachment and damage, which increases the influence of film thickness on the life of the die.

In a high-load environment, it is preferable that the A and B layers have a total film thickness of 8 μm or greater, more preferably 10 μm or greater.

Further, with excessive total film thickness, the hard film may be susceptible to detachment. Thus, it is preferable that the total film thickness be 15 μm or less. Further, it is preferable that the film thickness of the A layer be greater than that of the B layer.

In the present invention, it is preferable that the B layer have a surface roughness Ra of less than 0.2 μm, a surface roughness Rz of less than 2.0 μm, and a surface roughness Rsk of less than 0.

Since the hard film contains droplets, film defects, impurities, and the like in the surface thereof and is therefore unsuitable for use for the die, it is preferable to smoothen the surface of the hard film. Especially when the hard film is thick, accumulation of droplets and film defects leads to a reduction in surface roughness. Thus, it is preferable to smoothen the film surface.

Moreover, in a sliding environment, the projections on the film surface serve as an origin to attack on the workpiece, which causes abrasion powder to be produced, and thereby causes film detachment and/or abrasion.

Thus, in order to regulate the frequency of projections, it is preferable to control the surface roughness Rsk, in addition to controlling the common surface roughnesses Ra and Rz (ISO4287-1997).

The surface roughness Rsk (ISO4287-1997) is a parameter that indicates symmetry with respect to the center line of an amplitude distribution curve. For example, in the case of a film surface having many depressions therein, the surface roughness Rsk is less than 0, and in the case of a film surface having many projections thereon, the surface roughness Rsk is greater than 0. This parameter makes it possible to manage the frequency of projections and depressions. In the present invention, it is preferable that there be few projections, and it is preferable that the surface roughness Rsk be less than 0.

Moreover, it is preferable to control the surface roughnesses within the aforementioned ranges, because the oxide of vanadium is to be evenly formed from the initial stages on the surface of the base material in an environment where the die is used, thus improving sliding properties. Especially in the case of the iron-based workpiece, it is preferable to control the surface roughnesses within the aforementioned ranges. A reason for this is as follows: in the case of the iron-based workpiece, a ferrioxide adheres thinly and uniformly onto the oxide of vanadium all over the film; therefore, the ferrioxide per se contributes to improvement in sliding properties so that excellent sliding properties can be exhibited.

A key to achieving the preferred surface roughnesses of the present invention is a method of polishing after coating. With conventional methods for polishing coatings, such as a method of polishing with polishing paper and a method of polishing with irradiation of a medium composed of a resin and diamond particles, it is not easy to surely reduce projections, although surface roughnesses indicated by Ra and Rz can be reduced. Meanwhile, it is preferable to employ a method of buff polishing with a diamond paste, because this method makes it easy to achieve a flat and smooth surface with fewer projections.

The base material of the present invention is not to be particularly limited, but may be cold work die alloy tool steel, hot work die alloy tool steel, high-speed tool steel, cemented carbide, or the like.

Further, by employing the PVD method to cover the base material, such as cold die steel, hot die steel, or high-speed steel, with the hard film according to the present invention, a covering process is made possible at a temperature that is lower than the tempering temperature of the base material. This makes it possible to suppress variation in the dimensions of the base material. This also makes it possible to apply compressive residual stress to the hard film, thus improving the mechanical properties of the hard film. It is preferable to cover the base material with the hard film by employing, among other PVD methods, the arc ion plating method, which provides excellent film adhesion.

The base material may be subjected in advance to a surface-hardening process based on diffusion such as a nitriding process or a carburizing process.

EXAMPLE 1

In Example 1, the properties of film compositions were evaluated by conducting ball-on-disk tests.

As base materials to be treated, disk-shaped test pieces of high-speed steel SKH51 as defined in JIS (20 mm in diameter and 5 mm in thickness) were prepared. These test pieces had been thermally refined to be 64HRC by keeping them heated at 1180° C. in a vacuum, quenching them by cooling with nitrogen gas, and then tempering them at 560° C. Each of the base materials had its flat surface polished by a mirror polishing machine and then cleaned by ultrasonication with an alkali.

As deposition means, the arc ion plating method was used. The deposition was carried out by using a PVD apparatus structured such that the base material rotates at the center surrounded by a plurality of targets. Then, the base material was placed on a plate on a jig table in a chamber. The jig table had a planetary mechanism, and the plate had a rolling mechanism. The table and the plate on the table rotate independently of each other.

Next, in an arc ion plating apparatus having a chamber volume of 1.4 m$^3$ (a space in which the product to be processed is inserted is 0.3 m$^3$), thermal degassing was carried out in a vacuum of $1\times10^{-3}$ Pa at a temperature of 773 K, and then cleaning was carried out with Ar plasma at a temperature of 723 K.

Then, a reactant gas was introduced into the apparatus to cause the various targets to generate arc discharge, and coating was carried out at 723 K.

Samples Nos. 1 to 4 were each deposited by using a Cr target and a V target, applying an input current of 100 A to the Cr target, applying an input current of 150 A to the V target, setting the reactant gas pressure at 3 Pa, setting the number of revolutions of the table at 3 rpm, using nitrogen as the reactant gas, and applying a bias voltage of −100 V to the base material during coating. Further, Sample No. 3 was deposited by using nitrogen and methane as the reactant gas.

The deposition time was adjusted so that each of the samples had a total film thickness of 10 μm. Sample No. 5 was deposited by using a Cr target alone and applying an input current of 150 A to the Cr target.

After coating, each of the samples had its surface polished by buff polishing with a diamond paste having a particle diameter of 3 μm to have its surface roughnesses suitably adjusted.

The value of film surface roughness of each of the samples was measured with the use of a stylus roughness meter (SURFCOM 480A; manufactured by TOKYO SEIMITSU CO., LTD.) under the following conditions: an evaluation length of 4 mm, a measuring speed of 0.3 mm/s, and a cut-off value of 0.8 mm. Table 1 shows the film configurations and the surface roughnesses.

The total film thickness and the film thickness of VN or VCN (B layer) provided directly on the film of mutually laminated layers were measured by an optical microscope. The film thickness of each of the layers of the film of mutually laminated layers was measured by electron microscope observation.

In each of Samples Nos. 1 to 4, the film thickness of the individual VN or VCN layer of the film of mutually laminated layers was about 6 nm, and the film thickness of the individual CrN or CrCN layer was about 3 nm.

TABLE 1

| Sample No. | A layer | B layer | B layer film thickness/μm | Total film thickness/μm | Surface roughness Ra/μm | Rz/μm | Rsk | Remarks |
|---|---|---|---|---|---|---|---|---|
| 1 | CrN/VN | VN | 0.8 | 10 | 0.020 | 0.613 | −2.550 | Examples of |
| 2 | CrN/VN | VN | 0.2 | 10 | 0.019 | 0.609 | −3.022 | present |
| 3 | CrCN/VCN | VCN | 0.2 | 10 | 0.020 | 0.607 | −2.831 | invention |
| 4 | CrN/VN | — | — | 10 | 0.024 | 0.598 | −2.291 | Comparative |
| 5 | CrN | — | — | 10 | 0.023 | 0.652 | −3.112 | examples |

The testing conditions were as follows: with the use of a ball-on-disk tester (Tribometer; manufactured by CSM Instruments SA), the disk-shaped test piece was rotated at a speed of 150 mm/sec with a SUJ2 ball (6 mm in diameter) pressed at a load of 10 N against the coating film in an atmosphere at 25° C. (normal temperature) to 400° C. The testing distance was 100 m.

As for the depth of wear of a sliding part, the state of wear was evaluated by measuring depressions in a sliding part of the film at 1.5 mm/s with a surface roughness meter (SURFCOM 480A; manufactured by TOKYO SEIMITSU CO., LTD.).

Figure 1:
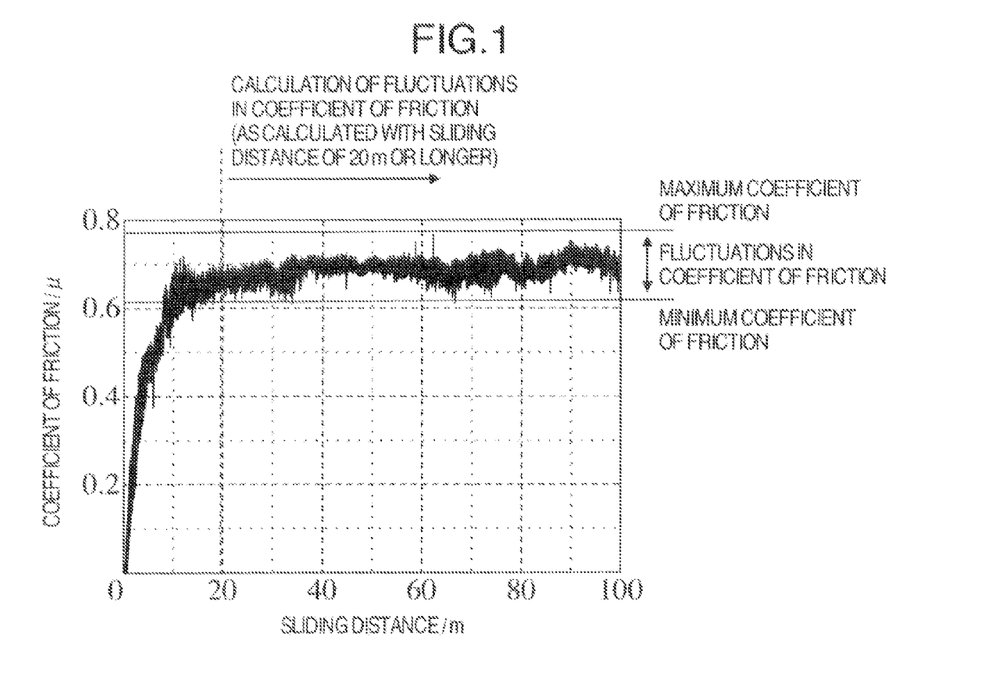
FIG. 1 is an example showing the fluctuations in friction coefficient with sliding distance for Sample No. 1, which is an example of the present invention.
Figure 2:
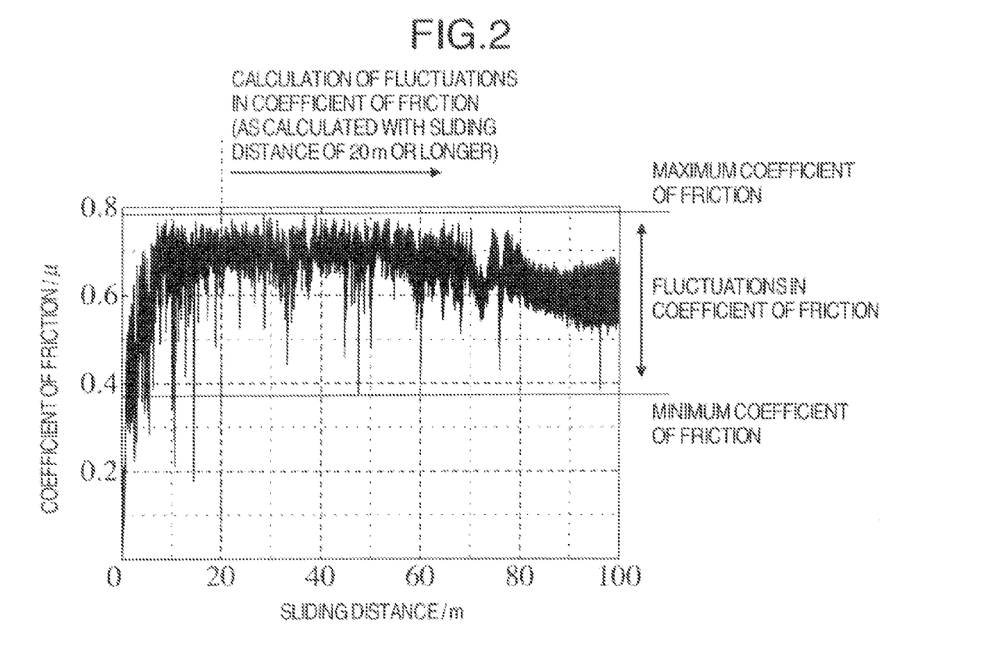
FIG. 2 is an example showing the fluctuations in friction coefficient with sliding distance for Sample No. 5, which is a comparative example.

As for sliding properties, the difference between the maximum coefficient of friction and the minimum coefficient of friction during each test was measured by using, as an index, the fluctuations in coefficient of friction during each measurement. A sample with large fluctuations in friction coefficient with sliding distance means a high sliding resistance, thus suffering from chattering during sliding. The fluctuations in friction coefficient with sliding distance were calculated with a testing distance in the range of 20 m to 100 m, where stable coefficients of friction were obtained. FIGS. 1 and 2 show examples of fluctuations in coefficient of friction of Samples Nos. 1 and 5, respectively. Table 2 shows the test results.

TABLE 2

| Sample No. | Depth of wear of sliding part/μm | | | Fluctuations in friction coefficient with sliding distance (maximum coefficient of friction − minimum coefficient of friction)/μ | | | Remarks |
|---|---|---|---|---|---|---|---|
| | 25° C. | 200° C. | 400° C. | 25° C. | 200° C. | 400° C. | |
| 1 | 0.1 | 0.1 | 0.1 | 0.16 | 0.08 | 0.13 | Examples of |
| 2 | 0.1 | 0.1 | 0.2 | 0.14 | 0.10 | 0.15 | present |
| 3 | 0.1 | 0.1 | 0.2 | 0.17 | 0.07 | 0.15 | invention |
| 4 | 0.1 | 0.1 | 0.1 | 0.18 | 0.10 | 0.16 | Comparative |
| 5 | 0.1 | 0.1 | 1.5 | 0.41 | 0.38 | 0.26 | examples |

In comparison with Sample No. 4, which has neither VN nor VCN directly on the film of mutually laminated layers, each of Samples Nos. 1 to 3, which are examples of the present invention, had small fluctuations in friction coefficient with sliding distance during sliding at temperatures ranging from room temperature to 400° C., suffered from no chattering, and exhibited excellent sliding properties. In particular, Sample No. 1, which has a thick VN film directly on the film of mutually laminated layers, exhibited excellent sliding properties because of the formation of a sufficient lubricant layer in the initial stages.

Sample No. 5, which is a single CrN layer, does not contain VN or VCN, which is excellent in sliding properties.

As such, Sample No. 5 exhibited large fluctuations in friction coefficient with sliding distance during sliding, and was poor in sliding properties.

EXAMPLE 2

In Example 2, the properties of film compositions were evaluated in harsher test environments by setting each of the films to have a smaller total film thickness and, furthermore, by conducting reciprocating frictional wear tests with greater loads on the hard films.

As base materials to be surface-treated, angular test pieces of die steel SKD61 as defined in JIS (each measuring 180 mm×20 mm×20 mm) were prepared. These test pieces had been thermally refined to be 45HRC by keeping them heated at 1050° C. in a vacuum, quenching them by cooling with nitrogen gas, and then tempering them at 560° C. Each of the base materials had its flat surface polished by a mirror polishing machine and then cleaned by ultrasonication with an alkali.

The deposition was carried out under the same conditions as in Example 1, except that the deposition time was adjusted so that the total film thickness was 4.0 or 4.5 µm. After coating, each of the samples had its surface polished by buff polishing with a diamond paste having a particle diameter of 3 µm to have its surface roughnesses suitably adjusted. The values of film surface roughness of each of the samples were measured in the same manner as in Example 1. Table 3 shows the film configurations and the surface roughnesses.

The film thicknesses were measured in the same manner as in Example 1. In each of Samples Nos. 6 to 8, the film thickness of the individual VN layer of the film of mutually laminated layers was about 6 nm, and the film thickness of the individual CrN layer was about 3 nm.

TABLE 3

| Sample No. | A layer | B layer | B layer film thickness/µm | Total film thickness/µm | Ra/ µm | Rz/ µm | Rsk | Remarks |
|---|---|---|---|---|---|---|---|---|
| 6 | CrN/VN | VN | 0.2 | 4.5 | 0.017 | 0.513 | −2.981 | Examples of |
| 7 | CrN/VN | VN | 0.2 | 4.0 | 0.018 | 0.406 | −3.193 | present invention |
| 8 | CrN/VN | — | — | 4.0 | 0.016 | 0.532 | −2.661 | Comparative |
| 9 | CrN | — | — | 4.0 | 0.018 | 0.724 | −3.710 | examples |

Next, the number of times the various films were damaged and the coefficients of friction of the various films were measured with the use of a reciprocating frictional wear tester (Kyowagiken Co., Ltd.). As a mating material to be slid on, SKD61 (45HRC) measuring 10 mm in diameter×16 mm was used. Each test was conducted under the following testing conditions: a measuring load of 200 kgf, a measuring speed of 150 mm/s, a sliding distance of 300 mm/reciprocation, normal temperature, and without lubrication. Evaluations were carried out according to the number of reciprocations at the time of exposure of the base material due to damage to the film. Table 4 shows the test results.

A comparison between Sample No. 7, which is an example of the present invention, and Samples Nos. 8 and 9, which are comparative examples, confirms that the number of reciprocations until exposure of the base material was increased by providing a thick VN film directly on the film of mutually laminated CrN and VN layers.

The ball-on-disk tests of Example 1 and the reciprocating frictional wear tests of Example 2 both confirmed that the film structures of the present invention exhibit excellent sliding properties.

Further, a comparison between Samples Nos. 6 and 7, which are examples of the present invention, confirmed that an increase in total film thickness leads to improvement in the number of reciprocations until exposure of the base material.

TABLE 4

| Sample No. | Number of reciprocations until exposure of base material | Coefficient of friction | Remarks |
|---|---|---|---|
| 6 | Not damaged | 0.33 | Examples of present invention |
| 7 | 115 | 0.33 | |
| 8 | 91 | 0.32 | Comparative examples |
| 9 | 85 | 0.37 | |

EXAMPLE 3

An example of the present invention and a comparative example having no VN film provided directly on the film of mutually laminated layers were evaluated by conducting reciprocating frictional wear tests. The deposition was carried out under the same conditions as in Example 1, except that the deposition time was adjusted so that the total film thickness was 10 µm.

The surfaces were smoothened by a commonly-used AERO LAP (AERO LAP is a registered trademark of Yamashita Works Co., Ltd.). Table 5 shows the film configurations and the surface roughnesses. The surface roughnesses and the film thicknesses were measured in the same manners as in Example 1.

In each of Samples Nos. 10 and 11, the film thickness of the individual VN layer of the film of mutually laminated layers was about 6 nm, and the film thickness of the individual CrN layer was about 3 nm.

TABLE 5

| Sample No. | A layer | B layer | B layer film thickness/μm | Total film thickness/μm | Surface roughness Ra/ μm | Rz/ μm | Rsk | Remarks |
|---|---|---|---|---|---|---|---|---|
| 10 | CrN/VN | VN | 0.8 | 10 | 0.081 | 0.998 | 1.412 | Example of present invention |
| 11 | CrN/VN | — | — | 10 | 0.081 | 0.829 | 1.344 | Comparative example |

The number of times the various films were damaged and the coefficients of friction of the various films were measured with the use of a reciprocating frictional wear tester (Kyowagiken Co., Ltd.). As a mating material to be slid on, SKD61 (45HRC) measuring 10 mm in diameter×16 mm was used. Each test was conducted under the following testing conditions: a measuring load of 200 kgf, a measuring speed of 150 mm/s, a sliding distance of 300 mm/reciprocation, normal temperature, and without lubrication.

Each reciprocating frictional wear test continued until the number of reciprocations reached 200. The depth of traces of scratch on the film surface after the test was calculated by observing the traces of scratch with the use of a laser microscope (KEYENCE CORPORATION: VK-8710) with a magnification of ×200 and measuring a profile of the surface. Table 6 shows the test results.

Since each sample had a great film thickness of 10 μm, neither sample suffered from chattering during the test even when the number of reciprocations was 200. It was confirmed that providing a thick VN film directly on the film of mutually laminated CrN and VN layers leads to a reduction in depth of traces scratch even if the surface roughness Rsk is a positive value.

TABLE 6

| Sample No. | Depth of traces of scratch after sliding test/ μm | Coefficient of friction | Remarks |
|---|---|---|---|
| 10 | 3.02 | 0.30 | Example of present invention |
| 11 | 4.80 | 0.37 | Comparative example |

EXAMPLE 4

Then, reciprocating frictional wear tests were conducted under favorable surface conditions. The deposition was carried out in the same manner as in Example 1, whereby Samples Nos. 12 to 23 shown in Table 7 were prepared.

For a variation in the ratio of the respective film thicknesses of the layers of the A layer, Sample No. 19 was deposited by applying an input current of 150 A to a Cr target and applying an input current of 100 A to a V target.

The AlCrSiN layer was deposited by using an $Al_{60}Cr_{37}Si_3$ target (each numerical value expressed in terms of atomic ratio; the same shall apply hereinafter).

The CrSiBN layer was deposited by using a $Cr_{92}Si_3B_5$ target.

The TiAlN layer was deposited by using a $Ti_{50}Al_{50}$ target. The TiN layer was deposited by using a Ti target.

In order to be in a favorable surface state, each of the samples had its surface roughnesses suitably adjusted by buff polishing with a diamond paste having a particle diameter of 3 μm.

Table 7 shows the film configurations and the surface roughnesses. The surface roughnesses and the film thicknesses were measured in the same manners as in Example 1.

In Sample No. 19, which was deposited under different conditions, the respective film thicknesses of the VN and CrN layers of the film of mutually laminated layers were both equally about 4 nm. In each of the other samples, the film thickness of the individual VN layer of the film of mutually laminated layers was about 6 nm, and the film thickness of the other individual layer was about 3 nm.

TABLE 7

| Sample No. | A layer (ratio of the respective film thicknesses) | B layer | B layer film thickness/μm | Total film thickness/μm | Surface roughness Ra/ μm | Rz/ μm | Rsk | Remarks |
|---|---|---|---|---|---|---|---|---|
| 12 | CrN/VN | VN | 0.8 | 10 | 0.016 | 0.701 | −2.650 | Examples of |
| 13 | CrN/VN | VN | 0.2 | 10 | 0.018 | 0.626 | −2.931 | present |
| 14 | CrN/VN | VN | 1.5 | 10 | 0.018 | 0.602 | −1.583 | invention |
| 15 | AlCrSiN/VN | VN | 0.2 | 10 | 0.019 | 0.732 | −3.832 | |
| 16 | CrSiBN/VN | VN | 0.2 | 10 | 0.017 | 0.638 | −2.224 | |
| 17 | AlCrSiN/VN | VN | 0.2 | 10 | 0.016 | 0.629 | −2.949 | |
| 18 | CrN/VN | VN | 0.06 | 10 | 0.017 | 0.687 | −3.818 | Comparative |
| 19 | CrN/VN (1:1) | VN | 0.2 | 10 | 0.018 | 0.702 | −2.435 | examples |
| 20 | CrN/VN | — | — | 10 | 0.019 | 0.611 | −3.237 | |
| 21 | CrN | — | — | 10 | 0.019 | 0.427 | −4.036 | |
| 22 | TiAlN/VN | VN | 0.2 | 10 | 0.018 | 0.639 | −3.148 | |
| 23 | TiN/VN | VN | 0.2 | 10 | 0.016 | 0.501 | −2.103 | |

Next, the number of times the various films were damaged and the coefficients of friction of the various films were measured with the use of a reciprocating frictional wear tester (Kyowagiken Co., Ltd.). As a mating material to be slid on, SKD61 (45HRC) measuring 10 mm in diameter×16 mm was used. Each test was conducted under the following testing conditions: a measuring load of 200 kgf, a measuring speed of 150 mm/s, a sliding distance of 300 mm/reciprocation, normal temperature, and without lubrication.

Each reciprocating frictional wear test continued until the number of reciprocations reached 200. The depth of traces of scratch on the film surface after the test was calculated by observing the traces of scratch with a laser microscope (KEYENCE CORPORATION: VK-8710) with a magnification of ×200 and measuring a profile of the surface. Table 8 shows the test results.

Figure 3:
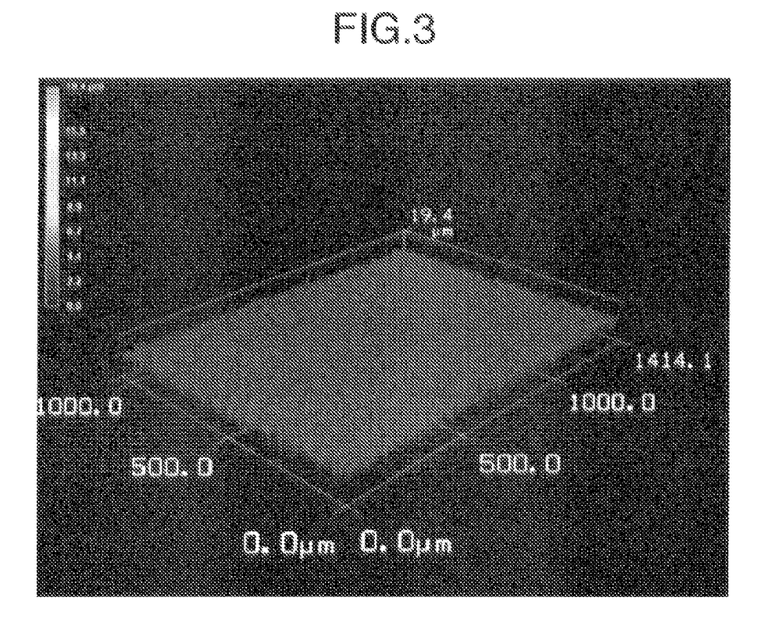
FIG. 3 shows a profile of a sliding surface after a reciprocating sliding test for Sample No. 12, which is an example of the present invention.
Figure 4:
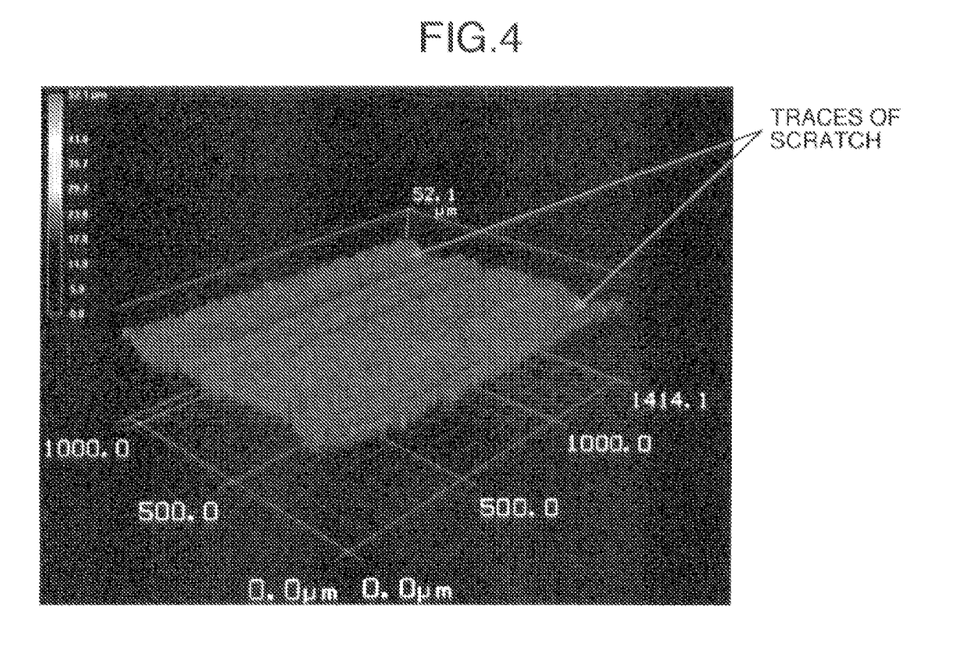
FIG. 4 shows a profile of a sliding surface after a reciprocating sliding test for Sample No. 21, which is a comparative example.

Further, FIGS. 3 and 4 show surface profiles of Samples Nos. 12 and 21, respectively.

TABLE 8

| Sample No. | Depth of traces of scratch after sliding test/ μm | Coefficient of friction | Remarks |
|---|---|---|---|
| 12 | Showed no trace of scratch | 0.28 | Examples of present invention |
| 13 | Showed no trace of scratch | 0.29 | |
| 14 | Showed no trace of scratch | 0.29 | |
| 15 | Showed no trace of scratch | 0.30 | |
| 16 | Showed no trace of scratch | 0.29 | |
| 17 | Showed no trace of scratch | 0.28 | |
| 18 | 2.97 | 0.31 | Comparative examples |
| 19 | 1.42 | 0.30 | |
| 20 | 5.43 | 0.32 | |
| 21 | 13.10 | 0.39 | |
| 22 | 8.37 | 0.35 | |
| 23 | 11.38 | 0.30 | |

Samples Nos. 12 to 17 of the present invention, which were in favorable surface states, showed no trace of scratch on the sliding surfaces after the sliding tests, nor did they suffer from any galling. As such, Samples Nos. 12 to 17 were excellent in sliding properties.

Sample No. 18, which has a thin VN film directly on the film of mutually laminated layers, was insufficient in conformability properties in the initial stages, although the film was in a favorable surface state. As such, Sample No. 18 was inferior in sliding properties to Samples Nos. 12 to 17 and showed traces of scratch.

Sample No. 19, in which the CrN and the VN layers of the films of mutually laminated layer are the same in film thickness, did not produce sufficient quantities of an oxide of vanadium, which enhances sliding properties. As such, Sample No. 19 showed traces of scratch.

Sample No. 20, which has no thick VN film provided directly on the film of mutually laminated layers, was poor in conformability properties in the initial stages, although the film was in a favorable surface state. As such, Sample No. 20 was inferior in sliding properties to Samples Nos. 12 to 17 and showed traces of scratch.

Sample No. 21, which is a single-layered CrN film and contains no VN layer, was poor in sliding properties regardless of the favorable surface state. As such, Sample No. 21 had traces of scratch deeply formed.

Samples Nos. 22 and 23 are a film of mutually laminated TiAlN and VN layers and do not contain chromium. Thus, even with a VN film provided directly on the film of mutually laminated layers, Samples Nos. 22 and 23 were poorer in heat resistance than a nitride containing a certain amount of chromium, and had traces of scratch deeply formed.

EXAMPLE 5

For measurement of the hardness of a film of mutually laminated layers, the hardness of each of samples which were each provided only with an A layer of Samples Nos. 13, 15, and 16 used in Example 4, was measured with the use of a Vickers hardness tester (HM100; manufactured by Mitsutoyo Corporation) with a load of 10 gf on the film surface.

In comparison with the film of mutually laminated CrN and VN layers, a film of mutually laminated layers with another element added to CrN is high in hardness and superior in abrasion resistance. In particular, the AlCrSiN layer, with Al and Si simultaneously added thereto, allowed the resulting A layer to have its hardness equal to or higher than 2500 HV. Table 9 shows the test results.

TABLE 9

| A layer | Vickers hardness HV10 |
|---|---|
| CrN/VN | 1839 |
| CrSiBN/VN | 2256 |
| AlCrSiN/VN | 2610 |

INDUSTRIAL APPLICABILITY

A covered member of the present invention has excellent sliding properties and can therefore be used for plastic working dies such as pressing working and casting dies for uses ranging from cold working to warm and hot working. Further, the covered member is also applicable to die-casting pins, insert dies, and sliding components that constitute various machines.

The invention claimed is:

1. A covered member with excellent sliding properties having a hard film on a working surface, the hard film including:
    an A layer, in the A layer an a1 layer and an a2 layer being alternately laminated, the a1 layer comprising a nitride, carbonitride, or oxynitride having 30% or more of chromium in terms of atomic ratio in metal (including metalloid; the same shall apply hereinafter) component, and the a2 layer comprising a nitride, carbonitride, or oxynitride having 60% or more of vanadium in terms of atomic ratio in metal component; and
    a B layer on top of the A layer, the B layer comprising a nitride, carbonitride, or oxynitride having 60% or more of vanadium in terms of atomic ratio in metal component,
    wherein each of the a1 and a2 layers of the A layer has a film thickness of 50 nm or less, with the film thickness of the a2 layer being greater than that of the a1 layer, and
    the B layer having a film thickness of 0.1 μm or greater.

2. The covered member with excellent sliding properties according to claim 1, wherein the film thickness of the a2 layer is 1.5 or more times greater than that of the a1 layer.

3. The covered member with excellent sliding properties according to claim 2, wherein the film thickness of the a2 layer is 2.0 or more and 4.0 or less times greater than that of the a1 layer.

4. The covered member with excellent sliding properties according to claim 1, wherein the A and B layers have a total film thickness of 4 µm or greater and 20 µm or less.

5. The covered member with excellent sliding properties according to claim 4, wherein the A and B layers have a total film thickness of 8 µm or greater.

6. The covered member with excellent sliding properties according to claim 1, wherein the B layer has a surface roughness Ra of less than 0.2 µm, a surface roughness Rz of less than 2.0 µm, and a surface roughness Rsk of less than 0.

7. The covered member with excellent sliding properties according to claim 1, wherein the B layer has a film thickness of 0.2 µm or greater.

8. The covered member with excellent sliding properties according to claim 1, wherein the B layer has a film thickness of 8 µm or less.

9. The covered member with excellent sliding properties according to claim 1, wherein the a1 layer contains 10% or more of aluminum in terms of atomic ratio in metal component.

10. The covered member with excellent sliding properties according to claim 1, wherein the a1 layer contains 1 to 10% of silicon in terms of atomic ratio in metal (including metalloid) component.

11. The covered member with excellent sliding properties according to claim 1, wherein the covered member is a die.

* * * * *